United States Patent [19]

Tokoda et al.

[11] 4,295,061
[45] Oct. 13, 1981

[54] LATCH CIRCUIT

[75] Inventors: Saburo Tokoda; Koichiro Okumura; Eiji Sugimoto, all of Tokyo, Japan

[73] Assignee: Nippon Electric Co., Ltd., Tokyo, Japan

[21] Appl. No.: 21,281

[22] Filed: Mar. 16, 1979

[30] Foreign Application Priority Data

Mar. 16, 1978 [JP] Japan .................................. 53/30773

[51] Int. Cl.³ .............................................. H03K 5/26
[52] U.S. Cl. ............................. 307/279; 307/DIG. 1
[58] Field of Search ........................ 307/DIG. 1, 279

[56] References Cited

U.S. PATENT DOCUMENTS

| | | | |
|---|---|---|---|
| 3,058,068 | 10/1962 | Hinrichs et al. | 330/110 |
| 3,882,331 | 5/1975 | Sasaki et al. | 307/279 |
| 3,925,689 | 12/1975 | Rubenstein | 307/DIG. 1 |
| 4,060,737 | 11/1977 | Gosney | 307/DIG. 3 |
| 4,084,129 | 4/1978 | Katakura | 330/110 |

OTHER PUBLICATIONS

"Insulated Gate Field Effect Transistor Sense Amplifier Latch" by J. G. Surgent, IBM Tech. Discl. Bull. vol. 13, No. 9, Feb. 1971, pp. 2670, 2671.

Primary Examiner—Harold A. Dixon
Attorney, Agent, or Firm—Sughrue, Mion, Zinn, Macpeak & Seas

[57] ABSTRACT

A latch circuit suited for a high-density semiconductor integrated circuit is disclosed, which comprises a first inverter circuit, a gating means for transferring an input signal to an input terminal of the first inverter circuit, a second inverter circuit having an input terminal coupled to the output of the first inverter circuit, and a transferring means for applying the output of the second inverter circuit to the input terminal of the first inverter circuit, the transferring means having substantially equal impedance characteristics in both directions.

6 Claims, 4 Drawing Figures

LATCH CIRCUIT

BACKGROUND OF THE INVENTION

This invention relates to a latch circuit, especially to a latch circuit employing insulated-gate type field-effect transistors and suited to be fabricated in a semiconductor integrated circuit.

Latch circuits are widely used in semiconductor integrated circuits for storing data or keeping circuit conditions. One of known latch circuits is composed of two serially coupled inverter circuits, sampling gate and feed-back gate for operatively coupling an output of the second-stage inverter to an input of the first-stage inverter. In operation, the sampling gate is enabled to apply on input signal into the first-stage inverter circuit during a first period and then, the input signal is latched by enabling the feed-back gate during a second period succeeding to the first period. However this latch circuit requires two control signals for controlling the sampling gate and the feed-back gate. Accordingly, complicated timing signal generator and large area of wiring lines for supplying two control signals to the latch circuit are necessitated. Therefore, it has been difficult to incorporate the latch circuits into the high-density semiconductor integrated circuit with large scale integration.

SUMMARY OF THE INVENTION

It is an object of this invention to provide a latch circuit which is fabricated in a small area in an integrated circuit.

It is another object of this invention to provide a latch circuit operable with a single control signal and with small value of ratio construction.

The latch circuit according to this invention comprises a first inverter to which an input signal is applied, a second inverter which receives an output of the first inverter, and transfer means whose non-linear impedances in both directions are substantially equal, for applying an output of the second inverter to an input of the first inverter therethrough. Here, the transfer means is constructed in such a manner that two insulated gate field-effect transistors, favorably of the depletion type, the gates and drains or sources of which are connected in common respectively are serially connected in an inverse relationship for the source and drain directions.

In one embodiment of this invention, the latch circuit comprises a signal input terminal, a control signal terminal, a latch output terminal, a first insulated-gate field-effect transistor (hereinafter abbreviated as IGFET) of enhancement type having a drain coupled to the signal input terminal and a gate coupled to the control signal terminal, a first inverter circuit having an input terminal coupled to a source of the first IGFET, a second inverter circuit having an input terminal coupled to an output of the first inverter circuit and an output terminal coupled to the latch output terminal, a second IGFET of depletion type having a gate and a drain coupled to the output terminal of the second inverter circuit in common, and a third IGFET of depletion type having a source coupled to the source of the second IGFET and a gate and a drain coupled to the input terminal of the first inverter circuit in common.

According to this invention, there is also provided a latch circuit which comprises an input terminal, a control signal terminal, an output terminal, a first IGFET of enhancement type having a drain coupled to the input terminal and a gate coupled to the control signal terminal, a first inverter circuit including a second IGFET of depletion type having a drain coupled to a first potential source and a third IGFET of enhancement type having a drain coupled to the source and gate of the second IGFET in common, a gate coupled to the source of the first IGFET and a source coupled to a second potential source, a second inverter circuit including a fourth IGFET of depletion type having a drain coupled to the first potential source, and a fifth IGFET of enhancement type having a drain commonly coupled to the source and gate of the fourth IGFET and further coupled to the output terminal, a gate coupled to the drain of the third IGFET and a source coupled to the second potential, a sixth IGFET of depletion type having a drain and a gate coupled to the output terminal in common, and a seventh IGFET of depletion type having a source coupled to the source of the sixth transistor and a gate and a drain coupled to the gate of the third IGFET, wherein absolute values of the threshold voltage of the sixth and seventh IGFETs are lower than those of the second and fourth IGFETs, and the sixth and seventh IGFETs have substantially the same channel area which is smaller than any of channel areas of the third and fifth IGFETs. Favorably, the size of the channel of the sixth IGFET is substantially equal to that of the seventh IGFET and smaller than that of the third IGFET or the fifth IGFET.

BRIEF DESCRIPTION OF THE DRAWINGS

FIG. 1b is a waveform diagram for explaining the operation of the latch circuit of the FIG. 1a;

DESCRIPTION OF THE PRIOR ART

First, with reference to FIGS. 1a and 1b, a conventional latch circuit will be described.

Figure 1A:
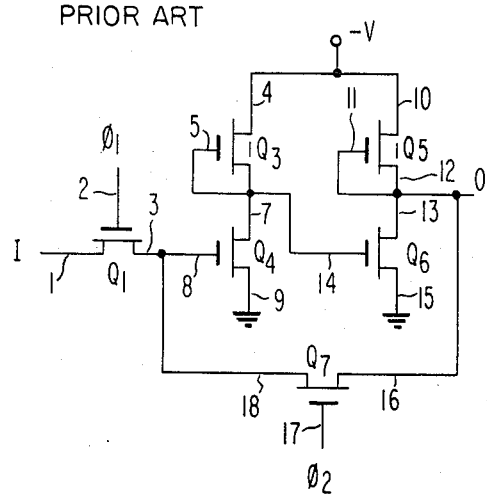
FIG. 1a is a circuit diagram showing a prior-art latch circuit.
Figure 1B:
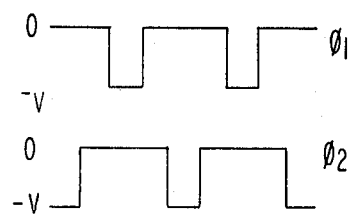

A circuit shown in FIG. 1a has heretofore been often employed. This latch circuit of FIG. 1a is constructed of P-channel enhancement type and P-channel depletion type IGFETs. Referring also to FIG. 1b, the operation of the latch circuit will be briefly explained. An input signal I is applied to the drain 1 of an enhancement type IGFET $Q_1$. In synchronism with a clock input signal $\phi_1$ applied to the gate electrode 2 of the IGFET $Q_1$, the input signal I is written into an input terminal 8 of a first-stage inverter composed of a depletion type load IGFET $Q_3$ and an enhancement type driving MOSFET $Q_4$. An output 6 of the first-stage inverter is applied to an input terminal 14 of a second-stage inverter composed of a depletion type load IGFET $Q_5$ and an enhancement type driving IGFET $Q_6$. An output 12 of the second-stage inverter is coupled to output terminal 0 of the latch circuit and fed back to the input terminal 8 of the first-stage inverter through an enhancement type IGFET $Q_7$ controlled by a clock signal $\phi_2$ whose phase does not overlap the phase of the clock signal $\phi_1$. Since the line 16 derived from the second-stage inverter and the input terminal 8 of the first-stage inverter have the same phase, the signal voltage of the terminal 8 having decayed due to leakage current etc. is refreshed each time the clock input signal $\phi_2$ is impressed on the gate electrode 17 of the IGFET $Q_7$. Accordingly, the prior-art latch circuit shown in FIG. 1a has the feature that even when the signal voltage of the terminal 8 has decayed into 0 (V), the data is refreshed by every impression of the clock signal $\phi_2$. On the other hand, however, the latch circuit has the disadvantage that since the clock signal $\phi_2$ is required, a comparatively large occupying area is taken in case of forming the latch circuit within a semiconductor integrated circuit.

Another conventional latch circuit will be explained with reference to FIG. 2.

Figure 2:
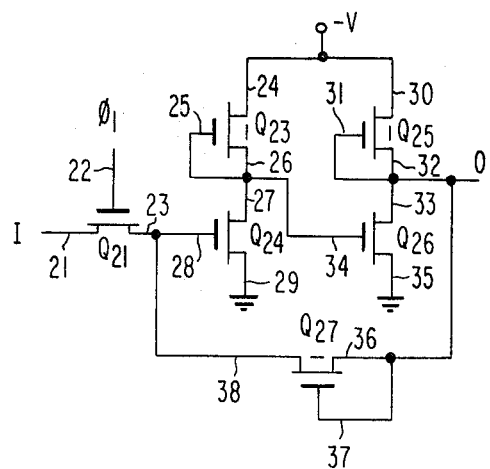
FIG. 2 is a circuit diagram showing another prior-art latch circuit.

The latch circuit of FIG. 2 has eliminated the disadvantage of the necessity for the two clock signals, and requires only the clock signal $\phi_1$ for loading data.

As is similarly in the circuit of FIG. 1a, an input signal I is applied through an enhancement type IGFET $Q_{21}$ to the input terminal 28 of the first-stage inverter composed of a depletion type load IGFET $Q_{23}$ and an enhancement type driving IGFET $Q_{24}$. An output node 26 of the second-stage inverter is coupled to an input terminal 34 of a second-stage inverter composed of a depletion type load IGFET $Q_{25}$ and an enhancement type driving IGFET $Q_{26}$. The output terminal 32 of the second-stage inverter is coupled to the output terminal 0 of the latch circuit and fed back to the input terminal 28 of the first-stage inverter through a depletion type IGFET $Q_{27}$. This depletion type IGFET $Q_{27}$ does not need the clock signal $\phi_2$ as in the circuit of FIG. 1a, and has its gate electrode 37 connected to its drain 36. Since the circuit shown in FIG. 2 does not require the clock input signal $\phi_2$ used in FIG. 1a, it has a simpler circuit arrangement. This latch circuit of FIG. 2, however, has a disadvantage as stated below. The impedance of the feed-back path composed of IGFET $Q_{27}$ varies dependent on direction, that is, the impedance in the case where the drain side is at the negative potential differs from the impedance in the case where the source side is at the negative potential. Accordingly, a margin in the sizes of IGFET $Q_{27}$ is required for overcoming this directional impedance characteristic. This margin remarkably increases the area for IGFET $Q_{27}$ and also increases its capacitance due to the increased area of the junction of IGFET $Q_{27}$. This increase of the capacitance furthermore lowers the operation speed in the second-stage inverter. Therefore, for avoiding this problem in the operation speed, the driving ability of IGFET $Q_{26}$ must be improved. For this purpose, the dimensions or size of IGFET $Q_{26}$ is also made large. Typical example of channel dimensions of IGFETs in the circuit of FIG. 2 are indicated in Table 1 where $-5$ V and 0 V are used as the power source.

TABLE 1

| | Channel length (μm) | Channel width (μm) |
|---|---|---|
| $Q_{21}$ | 5 | 7 |
| $Q_{23}$ | 10 | 7 |
| $Q_{24}$ | 5 | 30 |
| $Q_{25}$ | 10 | 7 |
| $Q_{26}$ | 5 | 30 |
| $Q_{27}$ | 50 | 5 |

As is clear from Table 1, IGFETs $Q_{26}$ and $Q_{27}$ require large dimensions that result in large areas respectively. Especially, the large area of IGFET $Q_{27}$ requires a special area of $50 \times 5$ μm² which disturbs layout on a semiconductor wafer.

DETAILED DESCRIPTION OF THE PREFERRED EMBODIMENT

Figure 3:
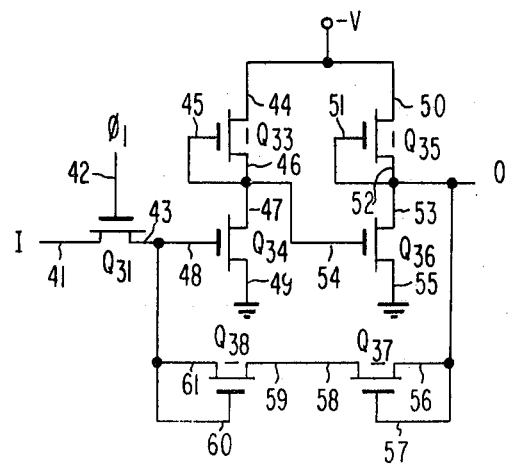
FIG. 3 is a circuit diagram showing an embodiment of this invention.

Referring now to FIG. 3, an embodiment of this invention will be described. In this embodiment, P-channel enhancement type and P-channel depletion type IGFETs are employed. An input signal I is applied to a drain 41 of an enhancement type IGFET $Q_{31}$. A clock signal $\phi_1$ is applied to a gate electrode 42 of the IGFET $Q_{31}$ for controlling sampling operation. The source 43 of the IGFET $Q_{31}$ is coupled to a gate 48 of a driving IGFET $Q_{34}$ of enhancement type in a first-stage inverter. A drain 44 of a load IGFET $Q_{33}$ of depletion type in the first-stage inverter is coupled to a predetermined power supply $(-V)$. A gate 45 of IGFET $Q_{33}$ is coupled to the junction of the source 46 of IGFET $Q_{33}$ and the drain 47 of driving IGFET $Q_{34}$ and further to a gate 54 of a driving IGFET $Q_{36}$ of enhancement type in a second-stage inverter. A drain 50 of a load IGFET $Q_{35}$ of depletion type in the second-stage inverter is coupled to the predetermined power supply $(-V)$. A gate 51 and a source 52 of IGFET $Q_{35}$ and drain 53 of IGFET $Q_{36}$ are commonly coupled to an output terminal O of this latch circuit and to a drain 56 and a gate 57 of a depletion type IGFET $Q_{37}$ for signal feedback. A source 58 of IGFET $Q_{37}$ is coupled to a source 59 of a depletion type IGFET $Q_{38}$ for signal feedback. Both a gate 60 and a drain 61 of IGFET $Q_{38}$ are commonly coupled to the input terminal of the first-stage inverter, i.e., the drain 48 of IGFET $Q_{34}$. It is the same as in the cases of the prior arts of FIG. 1a and FIG. 2 that the output O of the latch circuit can be derived from the source 52 of IGFET $Q_{35}$. Here, it is favorable that the threshold values (threshold voltages) of the feedback IGFETs $Q_{37}$ and $Q_{38}$ are set to be smaller in the absolute value than those of the load IGFETs $Q_{33}$ and $Q_{35}$. By connecting the gate electrode and drain of IGFET $Q_{37}$ with the output 62 of the second-stage inverter, the decay of the level at the input of the first-stage inverter attributed to leakage current etc. can be compensated whenever the output of the second-stage inverter, i.e. output O, takes a negative potential. Simultaneously therewith, since IGFET $Q_{38}$ is inserted, the impedance as viewed from the drain side of IGFET $Q_{37}$, i.e. the impedance from the output O to the input of the first-stage inverter, and the impedance as viewed from the drain side of IGFET $Q_{38}$, i.e. the impedance from the input of the first stage inverter to the output O, are almost equal. Since the two feedback IGFETs are used in this manner, the geometries of the transistors at the layout are versatile and can be made small. One example of channel dimensions for IGFETs employed in the circuit shown in FIG. 3 are indicated in Table 2. These values are in the case where $-5$ V and 0 V are used as power sources and threshold values of IGFETs are 3.8 V for each depletion type transistors and $-0.7$ V for each enhancement type transistors.

TABLE 2

| MOSFET | Channel length (μm) | Channel width (μm) |
|---|---|---|
| $Q_{31}$ | 5 | 7 |
| $Q_{33}$ | 10 | 7 |
| $Q_{34}$ | 5 | 30 |
| $Q_{35}$ | 10 | 7 |
| $Q_{36}$ | 5 | 25 |
| $Q_{37}$ | 10 | 5 |
| $Q_{38}$ | 10 | 5 |

As is clear from Table 2, the drivability, i.e. channel dimensions, of IGFET $Q_{36}$ is reduced to $5\times 25$ $\mu m^2$ in comparison with that of IGFET $Q_{26}$ of $5\times 30$ $\mu m^2$ in FIG. 2. Channel dimensions of IGFET $Q_{37}$ and $Q_{38}$ are also remarkably reduced to $10\times 5$ $\mu m^2$ respectively in comparison with that of IGFET $Q_{27}$ of $50\times 5$ $\mu m^2$ in FIG. 2. Therefore, the circuit of FIG. 3 can be fabricated in a small area. Furthermore, IGFETs $Q_{37}$ and $Q_{38}$ can be arranged on an optional area of a semiconductor wafer with flexibility, since the small dimensions of IGFETs $Q_{37}$ and $Q_{38}$ do not require special areas on the wafer for their arrangements. Therefore, the density of the integrated circuit can be remarkably increased. This flexibility in the arrangement is further promoted by making the threshold values of IGFETs $Q_{37}$ and $Q_{38}$ smaller in the absolute value than those of the IGFETs $Q_{33}$ and $Q_{35}$ as described previously. Moreover, potential drops due to leakage current etc. can be suppressed. Besides, interconnections for the clock input signal $\phi_2$ in the prior art of FIG. 1a can be omitted, so that the occupying area of the latch circuit in the semiconductor integrated circuit can be reduced. The fact that the clock input signal $\phi_2$ becomes unnecessary in the latch circuit is not confined to only the reduction of the occupying area of the latch circuit, but it makes unnecessary the clock interconnections to the latch circuits which lie sporadically within the semiconductor integrated circuit. Even when compared with the prior art of FIG. 2, the embodiment has the flexibility in the arrangement. In this manner, the invention is greatly advantageous.

In the above, this invention has been described with the embodiment employing the P-channel enhancement type and depletion type IGFETs. Needless to say, however, the advantages are not spoiled even when only P-channel insulated-gate field-effect transistors are employed or when N-channel insulated-gate field-effect transistors are employed. Of course, when the insulated-gate field-effect transistors for the respective loads of the first-stage inverter and the second-stage inverter are not of the depletion type but are of the enhancement type, the gate electrode 45 of IGFET $Q_{33}$ and the gate electrode 51 of IGFET $Q_{35}$ may be connected to the predetermined power supply provided that the drain electrode 44 of IGFET $Q_{33}$ and the drain 50 of IGFET $Q_{35}$ are connected to the identical power supply in the circuit arrangement of FIG. 3. The advantages of this invention are not spoiled even when the drains are respectively connected to different power supplies.

We claim:

1. A circuit comprising a first inverter circuit having input and output terminals, means for applying an input signal to the input terminal of said first inverter circuit, a second inverter circuit having an input terminal coupled to the output terminal of said first inverter circuit and having an output terminal, and feed-back means coupled between said input terminal of the first inverter circuit and said output terminal of the second inverter circuit, said feed-back means including a first insulated-gate field-effect transistor having a drain, a gate and a source, the drain and gate of said first transistor being commonly coupled to the output of said second inverter circuit, and a second insulated-gate field-effect transistor having a gate, a drain and a source, the source of said second transistor being coupled to the source of said first transistor, the gate and drain of said second transistor being commonly coupled to the input terminal of said first inverter circuit.

2. An integrated latch circuit comprising:
an input terminal,
an output terminal,
a first insulated-gate field-effect transistor having a drain coupled to said input terminal, a gate supplied with a control signal, and a source,
a first load element having a first electrode coupled to a first potential and having a second electrode,
a second insulated-gate field-effect transistor having a drain coupled to the second electrode of said first load element, a gate coupled to the source of said first insulated gate field-effect transistor and a source coupled to a second potential,
a second load element having a first electrode coupled to said first potential and having a second electrode,
a third insulated-gate field-effect transistor having a drain coupled to the second electrode of said second load element, a gate coupled to the drain of said second insulated-gate field-effect transistor and a source coupled to said second potential,
a fourth insulated-gate field-effect transistor having a drain, a gate and a source, the drain and gate of said fourth transistor being coupled to the drain of said third insulated-gate field-effect transistor in common, and
a fifth insulated-gate field-effect transistor having a source coupled to the source of said fourth insulated gate field-effect transistor, a gate and a drain, the gate and drain of said fifth transistor being commonly coupled to the gate of said second insulated-gate field-effect transistor.

3. The circuit according to claim 2, wherein said fourth and fifth transistors are of depletion type.

4. The circuit according to claim 2 or 3, wherein said fourth and fifth transistors have substantially same channel area which is smaller than any of the channel areas of said second and third transistors.

5. The circuit according to claim 2 or 3, wherein the size of the channel of said fourth transistor is substantially equal to that of said fifth transistor and smaller than that of said second transistor or third transistor.

6. The circuit according to claim 2, wherein said first and second load elements include depletion type insulated-gate field-effect transistors.

* * * * *